(12) United States Patent
Xu et al.

(10) Patent No.: US 11,579,667 B2
(45) Date of Patent: Feb. 14, 2023

(54) ELECTROSTATIC DISCHARGE PROTECTION CIRCUIT, DISPLAY SUBSTRATE AND DISPLAY APPARATUS

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Zhuo Xu, Beijing (CN); Yajie Bai, Beijing (CN); Xiaolin Wang, Beijing (CN); Tongguo Ma, Beijing (CN); Yongli Ge, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 415 days.

(21) Appl. No.: 16/632,098

(22) PCT Filed: Jan. 4, 2019

(86) PCT No.: PCT/CN2019/070476
§ 371 (c)(1),
(2) Date: Jan. 17, 2020

(87) PCT Pub. No.: WO2020/140285
PCT Pub. Date: Jul. 9, 2020

(65) Prior Publication Data
US 2021/0223831 A1 Jul. 22, 2021

(51) Int. Cl.
*G06F 1/18* (2006.01)
*H05K 9/00* (2006.01)

(52) U.S. Cl.
CPC ........... *G06F 1/182* (2013.01); *H05K 9/0079* (2013.01)

(58) Field of Classification Search
None
See application file for complete search history.

(56) References Cited

U.S. PATENT DOCUMENTS 5,023,672 A * 6/1991 Paquette ............. H01L 27/0248
257/363
2003/0089979 A1* 5/2003 Malinowski ............ H01L 23/60
257/777

(Continued)

FOREIGN PATENT DOCUMENTS

CN 101354507 A * 1/2009 ........... H01L 27/124
CN 104570493 A 4/2015

(Continued)

*Primary Examiner* — James Wu
*Assistant Examiner* — Christopher L Augustin
(74) *Attorney, Agent, or Firm* — Dilworth & Barrese, LLP.; Michael J. Musella, Esq.

(57) ABSTRACT

An electrostatic discharge protection circuit, a display substrate and a display apparatus are disclosed. The electrostatic discharge protection circuit includes: a first conductive portion, having an end portion; and at least one electrostatic discharge portion, arranged on a same layer as the first conductive portion and spaced from the end portion of the first conductive portion, the at least one electrostatic discharge portion being configured to discharge electrostatic charges generated at the end portion of the first conductive portion.

16 Claims, 14 Drawing Sheets

(56) References Cited

U.S. PATENT DOCUMENTS

| | | | |
|---|---|---|---|
| 2005/0127444 A1* | 6/2005 | Watanabe | H01L 23/62 257/529 |
| 2007/0029615 A1 | 2/2007 | Lai | |
| 2008/0158766 A1* | 7/2008 | Oyama | H05K 1/026 361/220 |
| 2009/0200063 A1* | 8/2009 | Omerovic | H01T 4/08 174/250 |
| 2015/0092306 A1* | 4/2015 | Hou | H01L 27/0296 361/42 |
| 2015/0317011 A1* | 11/2015 | Chen | G06F 3/0446 345/174 |
| 2016/0283027 A1* | 9/2016 | Hao | G06F 3/0446 |
| 2019/0215949 A1* | 7/2019 | Lin | H05K 1/026 |
| 2020/0089349 A1 | 3/2020 | Xie et al. | |

FOREIGN PATENT DOCUMENTS

| | | | | |
|---|---|---|---|---|
| CN | 106201074 A | | 12/2016 | |
| CN | 107785350 A | | 3/2018 | |
| CN | 108666304 A | * | 10/2018 | ....... G02F 1/136204 |
| CN | 108666304 A | | 10/2018 | |

* cited by examiner (a)  (b)  (c)

XII-XII

ELECTROSTATIC DISCHARGE PROTECTION CIRCUIT, DISPLAY SUBSTRATE AND DISPLAY APPARATUS

TECHNICAL FIELD

Embodiments of the present disclosure relate to a field of display, and more particularly, to an electrostatic discharge protection circuit, a display substrate and a display apparatus.

BACKGROUND

In a manufacturing process of an existing display panel, a great amount of electrostatic charges are easy to accumulate on a substrate, and when two metal lines on the substrate are too close, electrostatic discharge is very likely to occur between the two metal lines, so as to break down an insulation layer around the metal lines, cause a signal line around the insulation layer to suffer from a short circuit, resulting in poor display.

SUMMARY

In first aspect of the present disclosure, it is provided an electrostatic discharge protection circuit, comprising:

a first conductive portion, having an end portion; and at least one electrostatic discharge portion, arranged on a same layer as the first conductive portion and spaced from the end portion of the first conductive portion, the at least one electrostatic discharge portion being configured to discharge electrostatic charges generated at the end portion of the first conductive portion.

In at least some embodiments, the at least one electrostatic discharge portion is positioned on at least one side surface of the end portion of the first conductive portion.

In at least some embodiments, the at least one electrostatic discharge portion is positioned on two opposite side surfaces of the end portion of the first conductive portion, and distances from the at least one electrostatic discharge portion to the two opposite side surfaces of the end portion are equal to each other.

In at least some embodiments, the electrostatic discharge protection circuit comprising at least two levels of electrostatic discharge units, wherein the at least two levels of electrostatic discharge units are arranged on at least one side surface of the end portion of the first conductive portion, each level of electrostatic discharge unit comprises the at least one electrostatic discharge portion, and distances between the at least two levels of electrostatic discharge units and the end portion of the first conductive portion are sequentially increased.

In at least some embodiments, one level of the at least two levels of electrostatic discharge units comprises a plurality of electrostatic discharge portions, and distances between the end portion of the first conductive portion and the plurality of electrostatic discharge portions in the same level of electrostatic discharge unit are equal to each other.

In at least some embodiments, the first conductive portion further comprises an extension portion, the extension portion extends from the end portion of the first conductive portion to the at least one electrostatic discharge portion, and an end of the extension portion is spaced from the at least one electrostatic discharge portion.

In at least some embodiments, the at least one electrostatic discharge portion is positioned on at least one side surface of the end of the extension portion.

In at least some embodiments, the electrostatic discharge protection circuit comprises at least two levels of electrostatic discharge units, wherein the at least two levels of electrostatic discharge units are arranged on at least one side surface of the end of the extension portion, each level of electrostatic discharge unit comprises the at least one electrostatic discharge portion, and distances between the end of the extension portion and the at least two levels of electrostatic discharge units are sequentially increased.

In at least some embodiments, one level of the at least two levels of electrostatic discharge units comprises a plurality of electrostatic discharge portions, and distances between the end of the extension portion and the plurality of electrostatic discharge portions in the same level of electrostatic discharge unit are equal to each other.

In second aspect of the present disclosure, it is provided a display substrate comprising the afore-mentioned electrostatic discharge protection circuit.

In at least some embodiments, the display substrate further comprises a second conductive portion, wherein the first conductive portion, the second conductive portion and the at least one electrostatic discharge portion are arranged on the same layer and spaced from each other, and a distance between the end portion of the first conductive portion and the second conductive portion is greater than a distance between the end portion of the first conductive portion and the at least one electrostatic discharge portion.

In at least some embodiments, the extension portion has a part extends towards a direction away from the second conductive portion.

In at least some embodiments, the first conductive portion comprises a first signal line, the second conductive portion comprises a second signal line, and a distance between an end portion of the first signal line and the second signal line is greater than a distance between the end portion of the first signal line and the at least one electrostatic discharge portion.

In at least some embodiments, the display substrate further comprises a base substrate, wherein the first signal line, the second signal line and the at least one electrostatic discharge portion all are positioned on the base substrate and arranged on the same layer.

In at least some embodiments, the display substrate further comprises an insulation layer and an active layer, wherein the insulation layer overlays each of the first signal line, the second signal line and the at least one electrostatic discharge portion, the active layer overlays the insulation layer, and the insulation layer is configured to enable the active layer to be insulated from each of the first signal line, the second signal line and the at least one electrostatic discharge portion.

In third aspect of the present disclosure, it is provided a display apparatus comprising the afore-mentioned display substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

When a machine frequently operates in an automated production line of an existing display panel, the machine is easy to accumulate a great amount of static electricity on a robot gripper or equipment due to dry air in most technical processes. In the case that the gripper or the equipment is in contact with the surface of the display panel, the static electricity on the gripper or the equipment may induce a metal layer of the display panel to generate an equal quantity of charges, and at the moment, if two long metal lines in the panel design are too close, it is very easy to generate electrostatic discharge to break down an insulation layer, resulting in that short circuits occur between a signal line and the metal lines in a subsequent process, which causes poor display.

Figure 1:
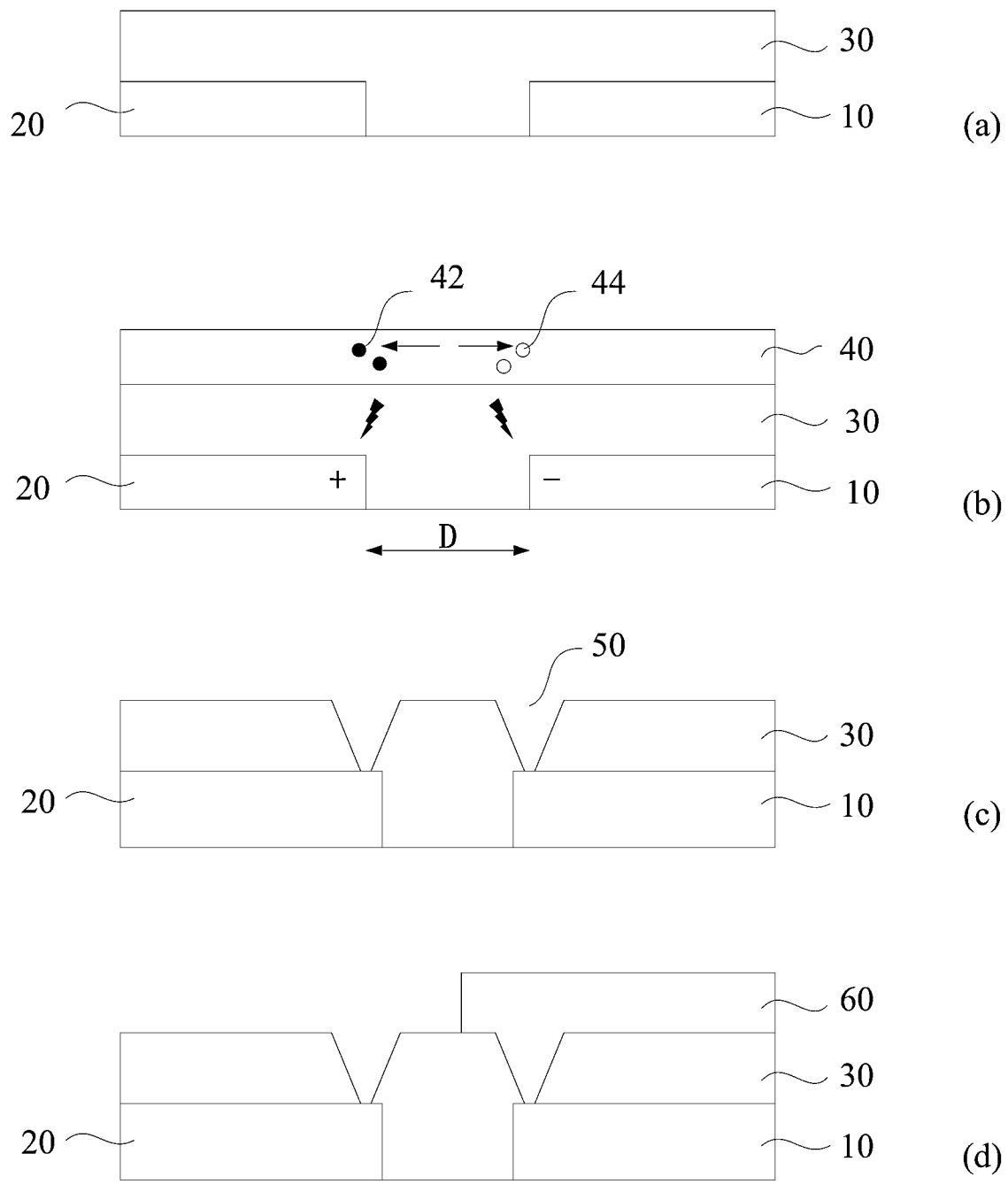
FIG. 1(a) to FIG. 1(d) are principle schematic diagrams showing electrostatic breakdown in a display panel.
Figure 2:
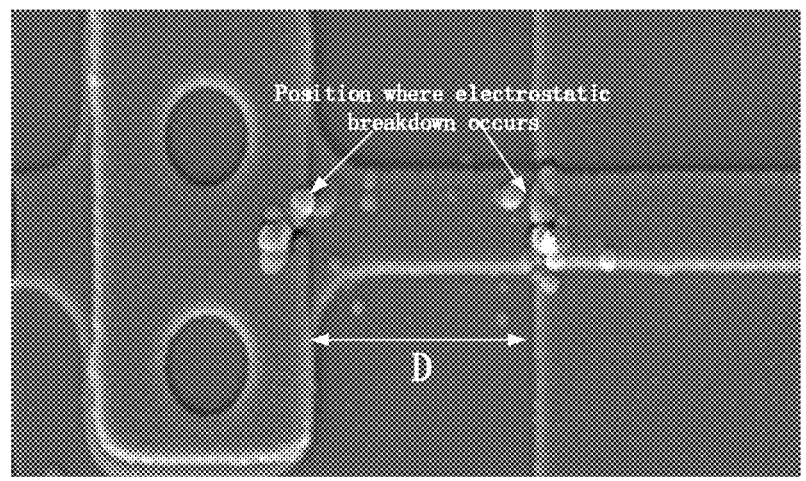
FIG. 2 is a scanning electron microscope showing electrostatic breakdown in partial positions of a display panel.
Figure 3:
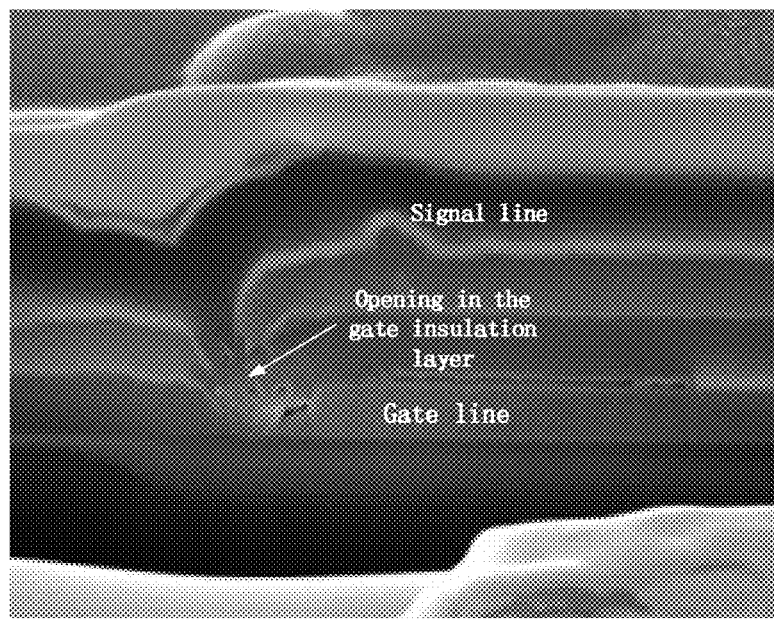
FIG. 3 is a scanning electron microscope showing a cross-sectional structure of a display panel when electrostatic breakdown occurs in the display panel.

FIG. 1(a) to FIG. 1(b) schematically show an electrostatic discharge phenomenon in a production process of a display panel. As illustrated in FIG. 1(a), after a gate line 10 and a common electrode line 20 are formed, a gate insulation layer 30 is formed. As illustrated in FIG. 1(b), an amorphous silicon layer 40 is deposited on the gate insulation layer 30. At the moment, a current channel may be formed in a portion of the amorphous silicon layer 40, which is positioned between the gate line 10 and the common electrode line 20, under the electrostatic action. The longer the current channel is, the smaller an electrostatic current is, and then the lower the probability of breaking the gate insulation layer 30 is. The shorter the channel is, the larger the electrostatic current is, and then the higher the probability of breaking the gate insulation layer 30 is. As people demands higher and higher on the narrow frame display panel, it is desirable that a minimum distance D between the gate line 10 and the common electrode line 20 be as small as possible. As illustrated in FIG. 1(b), in the case that D is excessively small, for example, D is smaller than 10 micrometers, the electrostatic current is relatively large, so that an electron 42 and a hole 44 are generated in the amorphous silicon layer 40, the gate insulation layer 30 is broken down and the product yield is severely influenced. As illustrated in FIG. 1(c), after the etching of the amorphous silicon layer 40 is completed, openings 50 remain in the broken gate insulation layer 30, and the openings 50 exposes surfaces of the gate line 10 and the common electrode line 20. As illustrated in FIG. 1(d), when a signal line 60 is formed on the gate insulation layer 30, the signal line 60 is electrically connected with the common electrode line 20 through the opening 50, resulting in the short circuit. FIG. 2 schematically shows a position where electrostatic breakdown occurs on the display panel. FIG. 3 schematically shows a sectional view when electrostatic breakdown occurs in the display panel.

An embodiment of the present disclosure provides an electrostatic discharge protection circuit, including: a first conductive portion having an end portion; and at least one electrostatic discharge portion, the at least one electrostatic discharge portion being arranged on the same layer with the first conductive portion and spaced from the end portion of the first conductive portion, and the at least one electrostatic discharge portion being configured to discharge electrostatic charges generated at the end portion of the first conductive portion. Because the electrostatic discharge portion is positioned near the end portion of the first conductive portion, the electrostatic charges accumulated at the end portion can be discharged by the electrostatic discharge portion, and thus, the electrostatic discharge portion can share a breakdown current so as to prevent static electricity from entering other effective circuits.

Figure 4:
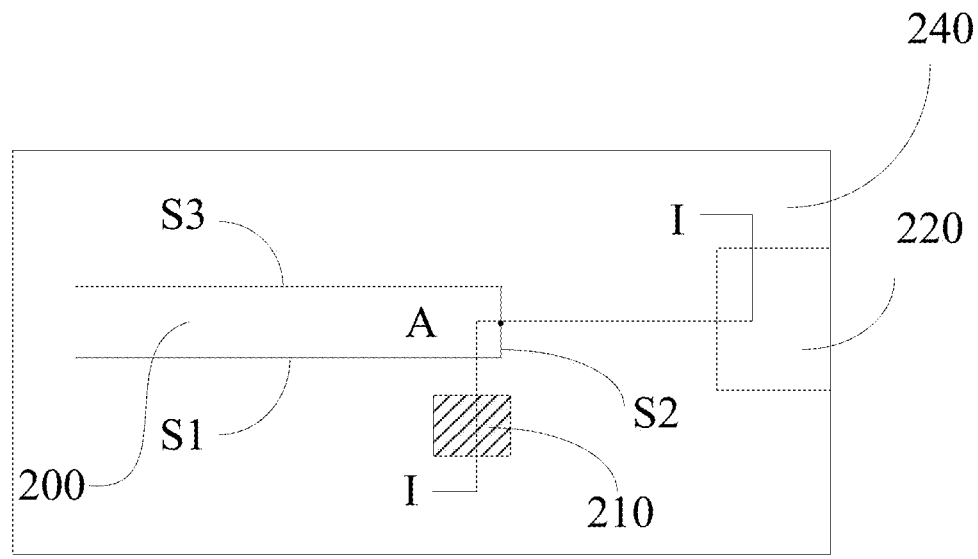
FIG. 4 is a schematic diagram of an electrostatic discharge protection circuit according to an embodiment of the present disclosure.
Figure 5:
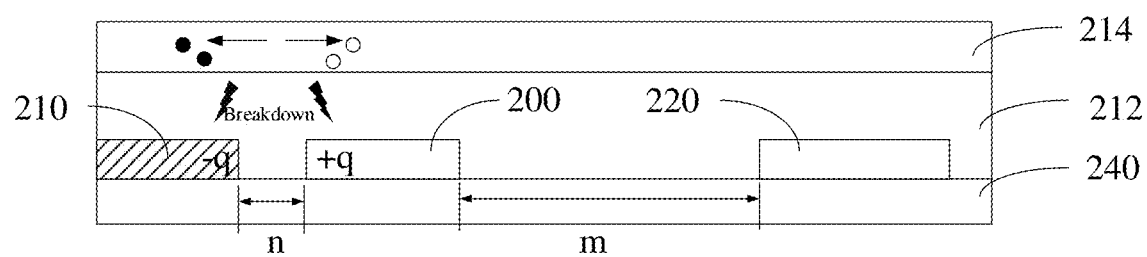
FIG. 5 is a sectional view along an I-I line in FIG. 4.

FIG. 4 is a schematic diagram of an electrostatic discharge protection circuit according to an embodiment of the present disclosure, and FIG. 5 is a sectional view along an I-I line in FIG. 4. For example, as illustrated in FIG. 4, the electrostatic discharge protection circuit is arranged on a substrate 240, and the electrostatic discharge protection circuit includes: a first conductive portion 200 having an end portion A; and at least one electrostatic discharge portion 210, the at least one electrostatic discharge portion 210 being arranged on the same layer with the first conductive portion 200 and spaced from the end portion A of the first conductive portion 210, and the at least one electrostatic discharge portion 210 being configured to discharge electrostatic charges q generated at the end portion A of the first conductive portion 210. Because the electrostatic discharge portion 210 is positioned near the end portion A of the first conductive portion 210, the electrostatic charges accumulated at the end portion A can be discharged by the electrostatic discharge portion 210, and thus, the electrostatic discharge portion 210 can share a breakdown current so as to prevent static electricity from entering other effective circuits.

In at least some embodiments, the electrostatic discharge protection circuit according to the above-mentioned embodiment is applied to a display substrate, the display substrate, for example, includes effective circuits such as a second conductive portion and the like, in this case, the first conductive portion, the second conductive portion and the at least one electrostatic discharge portion are all arranged on the same layer and spaced from one another, and a distance between the end portion of the first conductive portion and the second conductive portion is greater than a distance between the end portion of the first conductive portion and the at least one electrostatic discharge portion. For example, as illustrated in FIG. 4 and FIG. 5, the electrostatic discharge protection circuit further includes a second conductive portion 220, the second conductive portion 220 is arranged on the same layer with the electrostatic discharge portion 210 and the first conductive portion 200, and a distance m between the end portion A of the first conductive portion 200 and the second conductive portion 220 is greater than a distance n between the end portion A of the first conductive portion 200 and the electrostatic discharge portion 210. Because m is greater than n, electrostatic breakdown is easier to occur between the end portion A and the electrostatic discharge portion 210, and thus, the static electricity is prevented from entering the second conductive portion 220. In FIG. 5, an insulation layer 212 and an amorphous silicon layer 214 are formed on the first conductive portion 200, the electrostatic discharge portion 210 and the second conductive portion 220. In the case that the discharge occurs between the first conductive portion 200 and the electrostatic discharge portion 210, a discharge channel is formed in the amorphous silicon layer 214. For example, the second conductive portion in the display substrate may be a common electrode block or other block-shaped conductors, and also may be a signal line such as a common electrode line and the like.

In at least some embodiments, the at least one electrostatic discharge portion is positioned on at least one side surface of the end portion of the first conductive portion. For example, as illustrated in FIG. 4, the end portion A of the first conductive portion 200 has a first side surface S1, a second side surface S2 and a third side surface S3, the electrostatic discharge portion 210 is positioned on the first side surface S1 of the end portion A, and the electrostatic discharge portion 210 is spaced from the first side surface S1 by a distance n. It should be understood that the electrostatic discharge portion 210 may be positioned on the second side surface S2 or the third side surface S3 of the end portion A, which both can achieve the objective of discharge.

Figure 6:
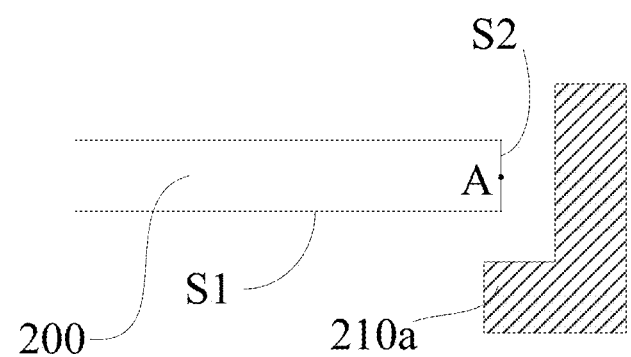
FIG. 6 is a schematic diagram of an electrostatic discharge portion according to another embodiment of the present disclosure.

In at least some embodiments, the at least one electrostatic discharge portion is positioned on two side surfaces of the end portion of the first conductive portion. For example, as illustrated in FIG. 6, the electrostatic discharge portion 210a is positioned on the first side surface S1 and the second side surface S2 of the end portion A of the first conductive portion 200. Compared to the situation of FIG. 4 in which the electrostatic discharge portion 210 is only arranged on the side surface S1, the electrostatic discharge portion 210a in FIG. 6 can form more discharge channels, which is beneficial for discharging more electrostatic charges.

Figure 7:
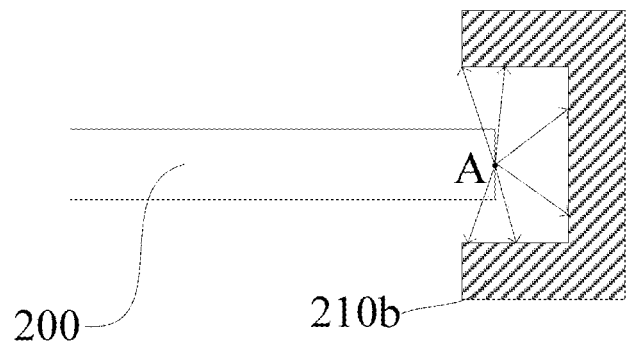
FIG. 7 is a schematic diagram of an electrostatic discharge portion according to yet another embodiment of the present disclosure.

In at least some embodiments, the at least one electrostatic discharge portion is positioned on three side surfaces of the end portion of the first conductive portion. For example, as illustrated in FIG. 7, the electrostatic discharge portion 210b is positioned on the first side surface S1, the second side surface S2 and the third side surface S3 of the end portion A of the first conductive portion 200. Compared to the situation of FIG. 6 in which the electrostatic discharge portion 210 is arranged on two side surfaces S1 and S2, the electrostatic discharge portion 210b in FIG. 7 can form more discharge channels (as shown by arrows), which is beneficial for discharging more electrostatic charges.

Figure 8:
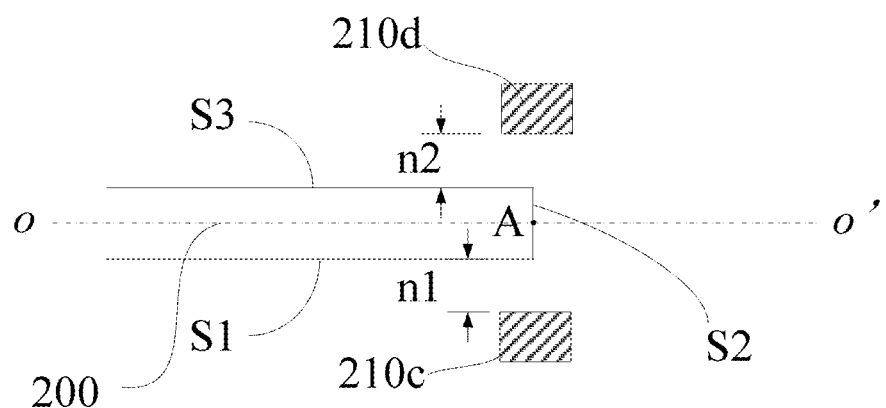
FIG. 8 is a schematic diagram of an electrostatic discharge portion according to still another embodiment of the present disclosure.

In at least some embodiments, the at least one electrostatic discharge portion is positioned on two opposite side surfaces of the end portion of the first conductive portion, and distances from the at least one electrostatic discharge portion to two opposite side surfaces of the end portion are equal to each other. For example, as illustrated in FIG. 8, the electrostatic discharge protection circuit includes two electrostatic discharge portions 210c and 210d, the electrostatic discharge portion 210c is positioned on the first side surface S1 of the end portion A of the first conductive portion 200, the electrostatic discharge portion 210d is positioned on the third side surface S3 of the end portion A of the first conductive portion 200, and two side surfaces S1 and S3 are respectively positioned on opposite sides of the first conductive portion 200. A distance n1 between the electrostatic discharge portion 210c and the first side surface S1 of the end portion A is equal to a distance n2 between the electrostatic discharge portion 210d and the third side surface S3 of the end portion A, i.e., n1=n2. In this way, the static electricity accumulated at the end portion A can be simultaneously discharged by the electrostatic discharge portions 210c and 210d positioned on the opposite sides of the first conductive portion 200, so that a great amount of electrostatic charges are more rapidly discharged. It should be understood that the electrostatic discharge portions 210c and 210d may be two individual parts, or may be integrated to form one-piece electrostatic discharge portion. For example, the electrostatic discharge portion may have a shape of the electrostatic discharge portion 210b in FIG. 7, and at the moment, the electrostatic discharge portions 210c and 210d can be regarded as two portions of the same electrostatic discharge portion. For example, the electrostatic discharge portions 210c and 210d are of a mirror symmetric structure with respect to an extension direction oo' (or called as a horizontal direction) of the first conductive portion 200. Therefore, not only can the electrostatic charges be more rapidly discharged, but also it is convenient for production. It should be understood that the electrostatic discharge protection circuit may include two, three, four or more electrostatic discharge portions, which are arranged around a tip A, so as to form more discharge channels.

Figure 9:
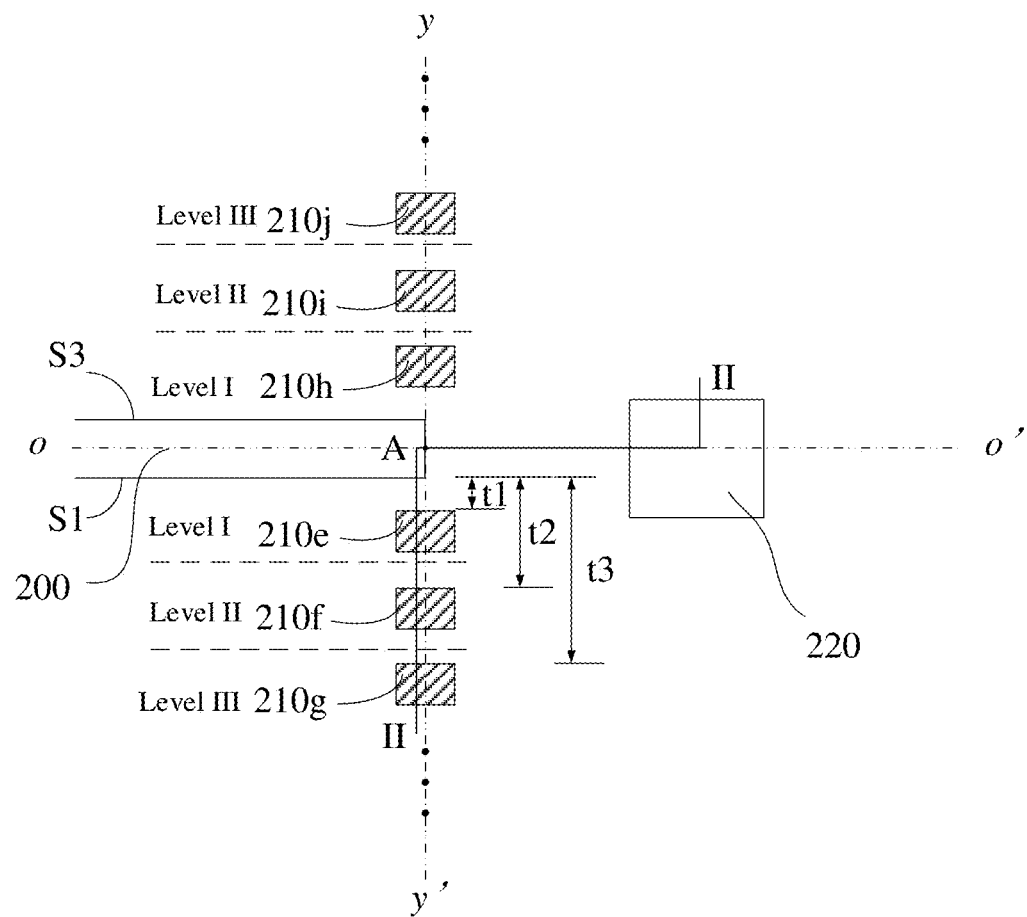
FIG. 9 is a schematic diagram of an electrostatic discharge protection circuit according to another embodiment of the present disclosure.
Figure 10:
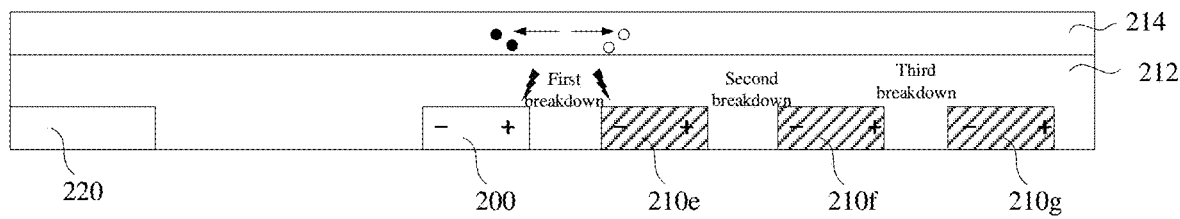
FIG. 10 is a sectional view along an II-II line in FIG. 9.

In at least some embodiment, the electrostatic discharge protection circuit includes at least two levels of electrostatic discharge units, the at least two levels of electrostatic discharge units are arranged on at least one side surface of the end portion of the first conductive portion; each level of electrostatic discharge unit includes the at least one electrostatic discharge portion, and distances between the at least two levels of electrostatic discharge units and the end portion of the first conductive portion are sequentially increased. For example, FIG. 9 is a schematic diagram of an electrostatic discharge protection circuit according to another embodiment of the present disclosure, and FIG. 10 is a sectional view along an II-II line in FIG. 9. For example, as illustrated in FIG. 9 and FIG. 10, multiple levels of electrostatic discharge units are arranged on both of the first side surface S1 and the third side surface S3 of the end portion A of the first conductive portion 200. For example, first-level to third-level electrostatic discharge units (i.e., level I to level III) are arranged on each of the first side surface S1 and the third side surface S3, and the distances between those three levels of electrostatic discharge units and the end portion A of the first conductive portion 200 are sequentially increased. For example, each level of electrostatic discharge unit includes a single electrostatic discharge portion, a spacing between an electrostatic discharge portion 210e of the first-level electrostatic discharge unit and the end portion A is t1, a spacing between an electrostatic discharge portion 210f of the second-level electrostatic discharge unit and the end portion A is t2, a spacing between an electrostatic discharge portion 210g of the third-level electrostatic discharge unit and the end portion A is t3, and then t1<t2<t3. The discharge principle of multiple levels of electrostatic discharge units will be specifically illustrated below by taking the electrostatic discharge portions 210e, 210f and 210g arranged on the first side surface S1 of the end portion A of the first conductive portion 200 as an example.

As illustrated in FIG. 10, in the case that the electrostatic charges accumulated at the end portion A of the first conductive portion 200 are discharged, the distance t1 between the end portion A and the first-level electrostatic discharge unit is the smallest among t1, t2 and t3, and thus, discharge firstly occurs between the end portion A and the electrostatic discharge portion 210e. Because each level of electrostatic discharge unit only can undertake breakage for once, and thus, after discharging the static electricity, the electrostatic discharge portion 210e becomes a new end portion of the first conductive portion 200. In the case that the static electricity is accumulated again, second discharge is continuously carried out on the second-level electrostatic discharge unit, i.e., second discharge occurs at the position of the electrostatic discharge portion 210f, and then the electrostatic discharge portion 210f becomes the new end portion of the first conductive portion 200. Next, in the case that the static electricity is accumulated again, third discharge is continuously carried out on the third-level electrostatic discharge unit, i.e., third discharge occurs at the position of the electrostatic discharge portion 210g. In this way, the electrostatic charges can be repeatedly discharged through multiple levels of discharge units, and the accumulated electrostatic charges can be discharged at any time, so as to reduce the risk that the electrostatic charges enter other effective circuits. Particularly for an electronic product, the electrostatic charges may be continuously accumulated at the end portion of the first conductive portion during a long manufacturing process of the electronic product. However, while multiple levels of discharge units are adopted, loss caused by a case that the electrostatic charges enter the internal effective circuits can be greatly reduced. In this embodiment, three electrostatic discharge portions 210e, 210f and 210g are arranged at an equal interval along a direction perpendicular to the extension direction oo' of the first conductive portion 200, and for example, three electrostatic discharge portions 210e, 210f and 210g are arranged at an equal interval along a vertical central line yy'. In other embodiments, three electrostatic discharge portions also may be not arranged along a straight line, or the spacings among the electrostatic discharge portions are unequal, but the above-mentioned objective also can be achieved. Electrostatic discharge portions 210h, 210i and 210j are arranged on the third side surface S3 of the end portion A of the first conductive portion 200, and can have the same or similar structures with the electrostatic discharge portions 210h, 210i and 210j or different structures from the electrostatic discharge portions 210h, 210i and 210j, which all shall fall within the scope of the present disclosure.

Figure 11:
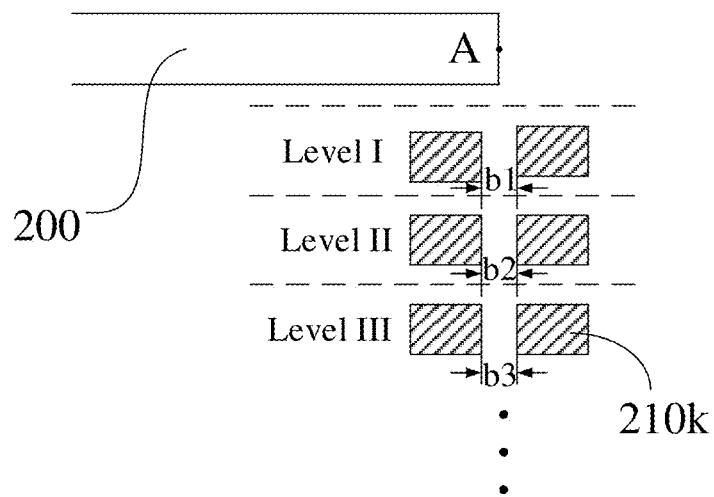
FIG. 11 is a schematic diagram of an electrostatic discharge circuit according to yet another embodiment of the present disclosure.

In at least some embodiments, at least one level of electrostatic discharge unit includes a plurality of electrostatic discharge portions, and distances between the plurality of electrostatic discharge portions in the same level of electrostatic discharge unit and the end portion of the first conductive portion are equal to each other. For example, each level of electrostatic discharge unit includes an equal number of electrostatic discharge portions, and the number of the electrostatic discharge portions is greater than or equal to two. For example, as illustrated in FIG. 11, each of the level I, level II and level III electrostatic discharge units includes two electrostatic discharge portions 210k, and distances between two electrostatic discharge portions 210k in each level of electrostatic discharge unit and the end portion A of the first conductive portion 200 are equal to each other. With respect to FIG. 9 in which each level of electrostatic discharge unit is provided with one single electrostatic discharge portion, two electrostatic discharge portions can more rapidly discharge the electrostatic charges and the electrostatic discharge effect is better. In FIG. 11, the spacing between two electrostatic discharge portions in a plurality of electrostatic discharge units is the same with each other, i.e., b1=b2=b3. It should be understood that such three spacings b1, b2, b3 may be different from one another, which also can achieve the above-mentioned technical effects.

Figure 12:
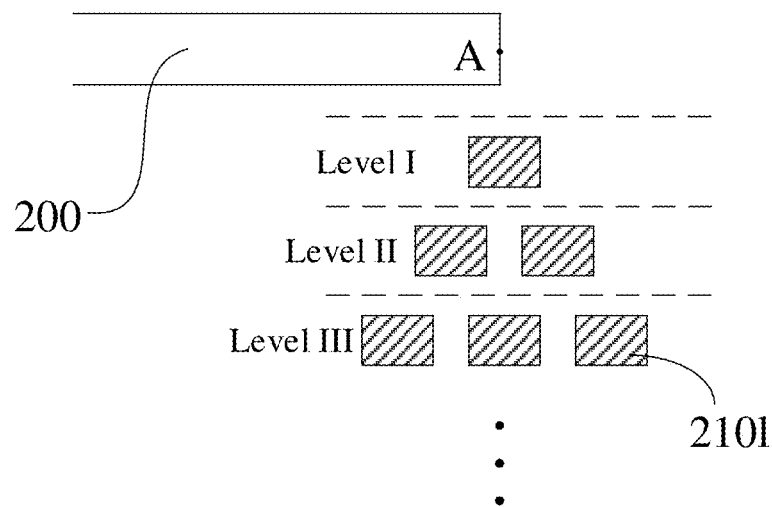
FIG. 12 is a schematic diagram of an electrostatic discharge circuit according to still another embodiment of the present disclosure.

For another example, each level of electrostatic discharge unit includes a different number of electrostatic discharge portions, and a higher level of electrostatic discharge unit is provided with more electrostatic discharge portions. For example, as illustrated in FIG. 12, the level I electrostatic discharge unit includes a single electrostatic discharge portion 2101, the level II electrostatic discharge unit includes two electrostatic discharge portions 2101, the level III electrostatic discharge unit includes three electrostatic discharge portions 2101, and so on. Optionally, it also may be that two electrostatic discharge portions 2101 are arranged in the level I electrostatic discharge unit, three electrostatic discharge portions 2101 are arranged in the level II electrostatic discharge unit, and so on. The electrostatic discharge circuit according to this embodiment can discharge more electrostatic charges step by step, and is particularly applicable to a case that more and more electrostatic charges are accumulated.

Figure 13:
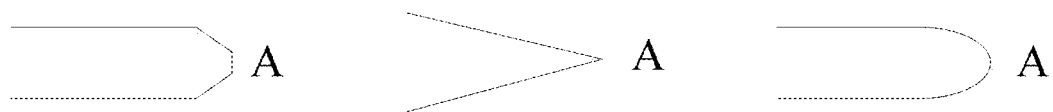
FIG. 13(a) to FIG. 13(c) schematically illustrates various shapes of end portions of conductive portions according to embodiments of the present disclosure.

In the embodiments of the present disclosure, the first conductive portion is made of a conductive material such as metal, alloy and the like; for example, the first conductive portion is the gate line, the data line and the like on the display substrate. The term "end portion" means a tail portion or a head portion of an object, and does not include limitation to the shape. For example, the end portion may be of various shapes, such as in a shape of a flat head, a round head or a sharp head and the like. For example, in FIG. 4 to FIG. 12, the end portion A of the first conductive portion 200 is of a flat head shape. For example, as illustrated in FIG. 13(a), the end portion A is of a tapered shape or a flat head shape with a chamfer. For example, as illustrated in FIG. 13(b), the end portion A is of a sharp head shape. For another example, as illustrated in FIG. 13(c), the end portion A is of a round head shape. Generally, charge distribution on the surface of a conductor is related to the shape of the conductor. For example, a protruding portion of the surface of the conductor is large in charge density; a relatively flat portion of the surface of the conductor is relatively small in charge density; and a recessed portion of the surface of the conductor is smaller in charge density. Therefore, the surface charge density of the isolated charged conductor is inversely proportional to curvature radius of the surface. In the display substrate, a tail portion of the charged signal line generally has a relatively high charge density and is easy to generate a tip discharge phenomenon. In the embodiments of the present disclosure, the second conductive portion is made of a conductive material such as metal, alloy and the like. In the display substrate, the second conductive portion, for example, is the common electrode block or other block-shaped conductors, and also may be the signal line such as the common electrode line and the like.

In at least some embodiments, the first conductive portion, the second conductive portion and the electrostatic discharge portion are made of the same material and arranged on the same layer, which is beneficial for simplifying a preparation production process. For example, as illustrated in FIG. 10, the first conductive portion 200, the second conductive portion 220 and the electrostatic discharge portions 210e, 210f and 210g are made of the same material and arranged on the same layer. For example, the production process of the above-mentioned structure includes: forming a metal layer on a base substrate, and patterning the metal layer by a single etching process to obtain a pattern of the first conductive portion 200, the second conductive portion 220 and the electrostatic discharge portions 210e, 210f and 210g. Next, the insulation layer 212 and the amorphous silicon layer 214 are formed on the first conductive portion 200, the second conductive portion 220 and the electrostatic discharge portions 210e, 210f and 210g. Therefore, the first conductive portion 200, the second conductive portion 220 and the electrostatic discharge portions 210e, 210f and 210g are obtained by a single patterning process, so that the production process is simplified. The term "patterning process" used in the embodiments of the present disclosure includes the process steps of photoresist coating, exposure, development, etching and the like.

Figure 14:
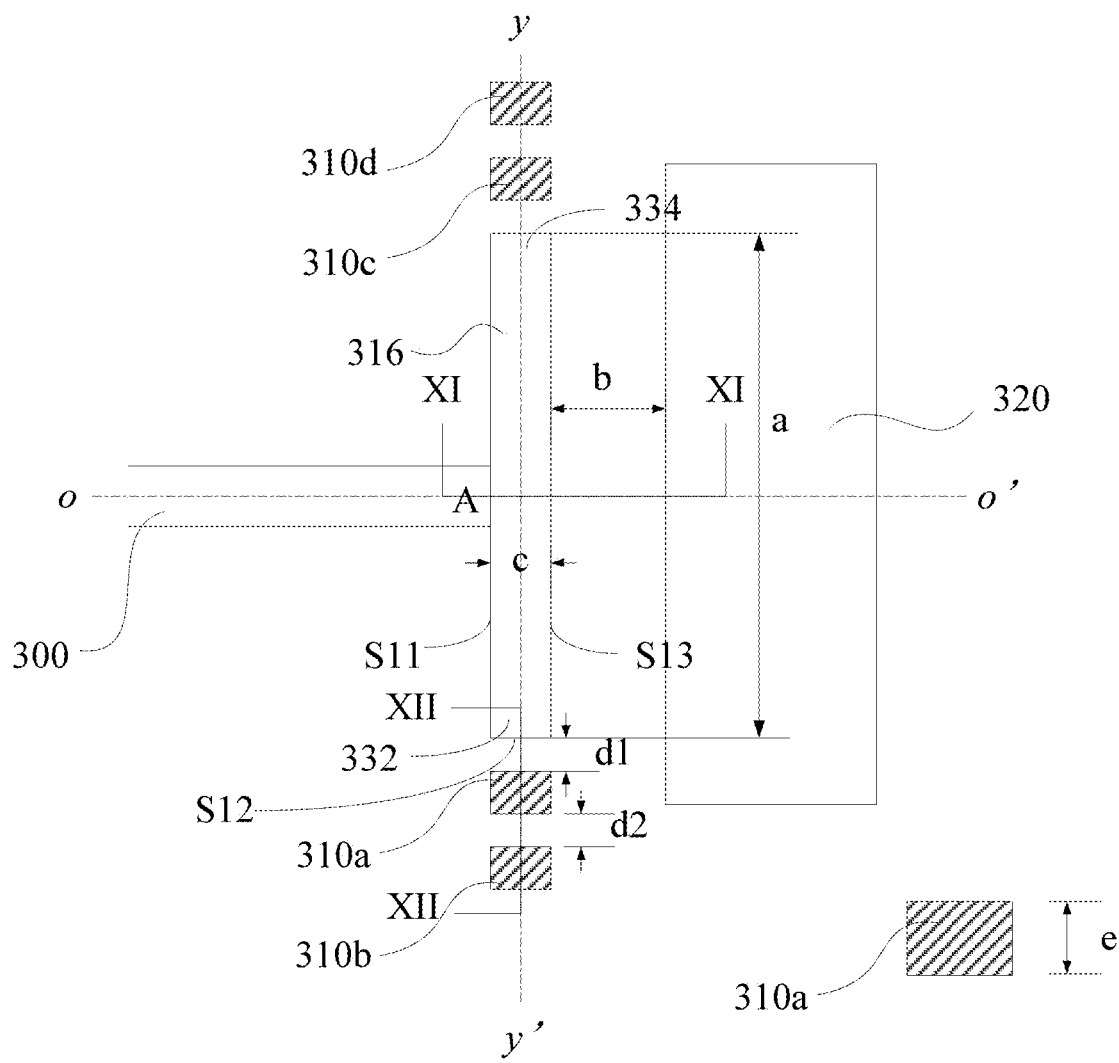
FIG. 14 is a schematic diagram of an electrostatic discharge protection circuit according to another embodiment of the present disclosure.
Figure 15:
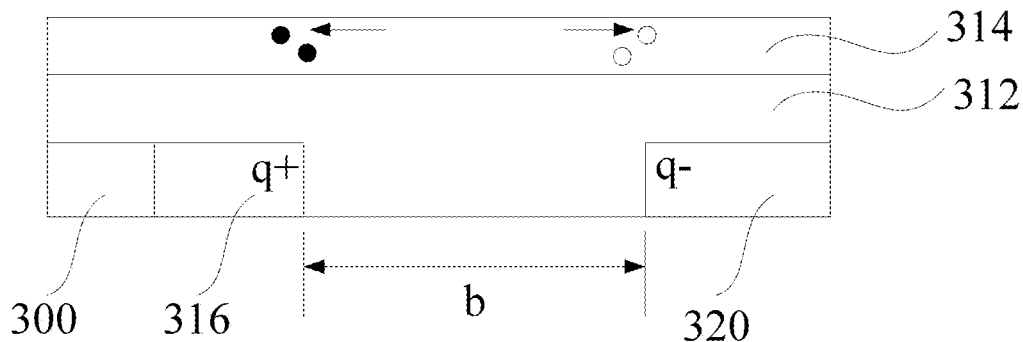
FIG. 15 is a sectional view along an XI-XI line in FIG. 14.
Figure 16:
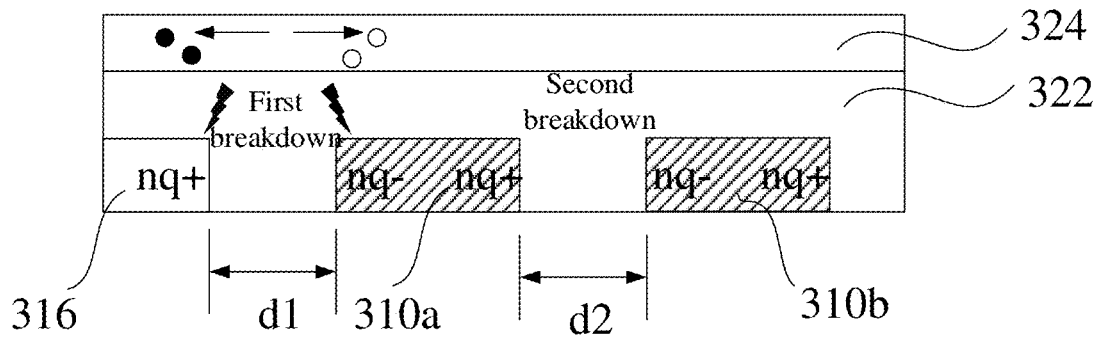
FIG. 16 is a sectional view along an XII-XII line in FIG. 14.

In at least some embodiments, the first conductive portion further includes an extension portion, the extension portion extends from the end portion of the first conductive portion to the at least one electrostatic discharge portion, and an end of the extension portion is spaced from the at least one electrostatic discharge portion. FIG. 14 a schematic diagram of an electrostatic discharge protection circuit according to yet another embodiment of the present disclosure, FIG. 15 is a sectional view along an XI-XI line in FIG. 14, and FIG. 16 is a sectional view along an XII-XII line in FIG. 14. As illustrated in FIG. 14, the electrostatic discharge circuit includes a first conductive portion 300, an extension portion 316 and electrostatic discharge portions 310a to 310d. The extension portion 316 extends from an end portion A of the first conductive portion 300 to the electrostatic discharge portions 310a and 310c respectively. Two ends 332 and 334 of the extension portion 316 are respectively spaced from the electrostatic discharge portions 310a and 310c. The materials of the extension portion 316 and the first conductive portion 300 may be the same or different. In the case that the materials of both the extension portion 316 and the first conductive portion 300 are the same, the extension portion 316 and the first conductive portion 300 can be formed in one-piece, so that the production process is simplified. For example, the extension portion 316 is formed by respectively protruding upwards and downwards from the end portion A of the first conductive portion 300 along a vertical direction. Therefore, there is no contact interface or gap between the extension portion 316 and the end portion A of the first conductive portion 300, and the electrostatic charges are easier to flow to the ends 332 and 334 of the extension portion 316 from the end portion A. A density of an electrostatic current of the end portion A is reduced and densities of electrostatic currents of the ends 332 and 334 of the extension portion 316 are increased, and thus, the electrostatic charges are preferably discharged at the ends 332 and 334 of the extension portion 316. Therefore, the extension portion 316 can reduce an electric field of the end portion A and enable the electrostatic charges to be easier to discharge from the ends 332 and 334 of the extension portion 316, so as to avoid a case that the electrostatic charges enter an effective circuit such as a second conductive portion 320. In this embodiment, the extension portion 316 in FIG. 14 is elongated and is of a mirror symmetric structure with respect to a central line oo' of the first conductive portion 300, and it should be understood that the extension portion 316 in other embodiments may be of other asymmetric shapes, for example, the extension portion only includes a portion below or above the central line oo' in FIG. 14, but the above-mentioned objective also can be achieved. It should be understood that the shape and an extension direction of the extension portion may be set according to a shape and a position of the second conductive portion, which will be described in subsequent embodiments.

With reference to FIG. 15 and FIG. 16, the electrostatic charge discharge principle between the extension portion 316 and the electrostatic discharge portions 310a and 310b is illustrated. In FIG. 14, a charge quantity on one side of the end portion A, which is close to the second conductive portion 320, is assumed as q+, the surface charge density of the isolated charged conductor is inversely proportional to the curvature radius of the surface, the surface on one side of the end portion A, which is close to the second conductive portion 320, is positioned in a flat region of the metal line, and the curvature radius of the surface is several times of that of the surface of the end 332, and thus, a surface charge quantity on the one side of the end portion A is a fraction of that at the end 332, and then the charge quantity at the end 332 of the extension portion 316 is nq+, which is n times of that at the end portion A. A spacing between the extension portion 316 and the second conductive portion 320 is b, a spacing between the extension portion 316 and the electrostatic discharge portion 310a is d1, and because d1 is much smaller than b (d1<<b), an inductive voltage difference between the extension portion 316 and the electrostatic discharge portion 310a is much greater than an inductive voltage difference between the extension portion 316 and the second conductive portion 320. Therefore, the electrostatic charges accumulated at the end portion A are preferably discharged between the extension portion 316 and the second conductive portion 320. Next, the electrostatic discharge portions 310a and 310b discharge the charges according to the above-mentioned electrostatic discharge principle of multiple levels of electrostatic discharge units in the previous embodiments. For example, the electrostatic discharge portion 310a is regarded as the first-level electrostatic discharge unit, and the electrostatic discharge portion 310b is regarded as the second-level electrostatic discharge unit. In the case that the static electricity is discharged between the extension portion 316 and the electrostatic discharge portion 310a, the electrostatic discharge portion 310a becomes the new end portion of the first conductive portion 300; and in the case that the static electricity is accumulated again, second discharge is continuously carried out on the second-level electrostatic discharge unit, i.e., second discharge is carried out at the position of the electrostatic discharge portion 310b. Therefore, the electrostatic charges can be repeatedly discharged and the accumulated electrostatic charges can be discharged at any time. The electrostatic discharge protection circuit according to the embodiments of the present disclosure can further share the electrostatic current of the end portion A of the first conductive portion 300 in a case of not increasing the spacing between the first conductive portion 300 and the second conductive portion 320, so that electrostatic breakdown is easier to occur at the ends 332 and 334 of the extension portion 316, thereby avoiding the case that the electrostatic charges enter the effective circuits such as the second conductive portion.

In at least some embodiments, a length of the extension portion is much greater than the distance between the first conductive portion and the second conductive portion. In at least some embodiments, the distance between the first conductive portion and the second conductive portion is greater than a spacing between the extension portion and the electrostatic discharge portion the closest to the extension portion. In at least some embodiments, a length of the electrostatic discharge portion is greater than a width of the extension portion. For example, as illustrated in FIG. 14, a represents a longitudinal length of the strip-shaped extension portion 316, b represents the distance (which also can be understood as a width between the adjacent signal lines and generally is greater than 5 micrometers) between the first conductive portion 300 and the second conductive portion 320, c represents a transverse width of the extension portion 316, d1 represents the spacing between the electrostatic discharge portion 310a and the extension portion 316, and e represents a longitudinal length of the electrostatic discharge portion 310a. In at least some embodiments, a>>b, thus, the electrostatic density of the end portion A of the first conductive portion 300 can be further weakened; for example, a is from 5b to 20b. In at least some embodiments, b>d, thus, the inductive voltage difference of the end of the extension portion 316 can be increased so as to benefit to discharge; for example, b is from 2d to 5d. In at least some embodiments, e>c so as to facilitate generating inductive charges on the surfaces of the electrostatic charges, which are opposite to the electrostatic discharge portion 310, and for example, e is from c to 5c.

In embodiments below, a position relationship between the end of the extension portion and the electrostatic discharge portion is discussed by taking one end 332 of the extension portion 316 in FIG. 14 as an example, and it should be understood that another end 334 of the extension portion 316 may have the same or similar structure with the end 332 or a different structure from the end 332, which all shall fall within the scope of the present disclosure.

In at least some embodiments, the at least one electrostatic discharge portion is positioned on at least one side surface of the end of the extension portion. For example, as illustrated in FIG. 14, the end 332 of the extension portion 316 has first to third side surfaces S11, S12 and S13, the electrostatic discharge portion 310a is positioned on the second side surface S12 of the end 332 of the extension portion 316. It should be understood that the electrostatic discharge portion 310a also may be positioned on the side surface S11 or S13, which also can achieve the objective of discharge.

Figure 17:
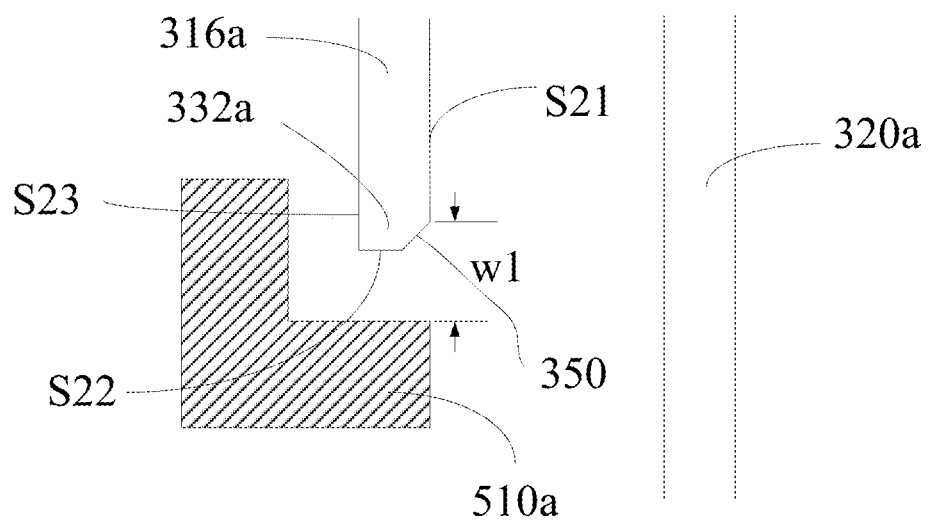
FIG. 17 is a schematic diagram of an extension portion according to an embodiment of the present disclosure.

For example, as illustrated in FIG. 17, an end 332a of an extension portion 316a has three side surfaces S21, S22 and S23, and an electrostatic discharge portion 510a is of an L shape and is arranged on two side surfaces S22 and S23 of the end 332a of the extension portion 316a, so that more discharge channels can be formed, thereby benefiting for discharging more electrostatic charges. The side surface S23 is further away from the second conductive portion 320a than the side surface S21, and thus, arranging the electrostatic discharge portion 510a on the side surface S23 can further avoid the case that the electrostatic charges are close to or enter the second conductive portion 320a. For example, on one side close to the second conductive portion 320a, the end 332a of the extension portion 316a includes a chamfer 350, the chamfer 350 increases a spacing between the end 332a on one side close to the second conductive portion 320a and the electrostatic discharge portion 510a, i.e., the spacing is W1, and then the electrostatic charges accumulated at the end 332a are easier to accumulate on another corner of the end 332a (i.e., the bottom left corner of the end 332a in the drawing), so that a larger electrostatic current can be undertook and more electrostatic charges are discharged.

Figure 18:
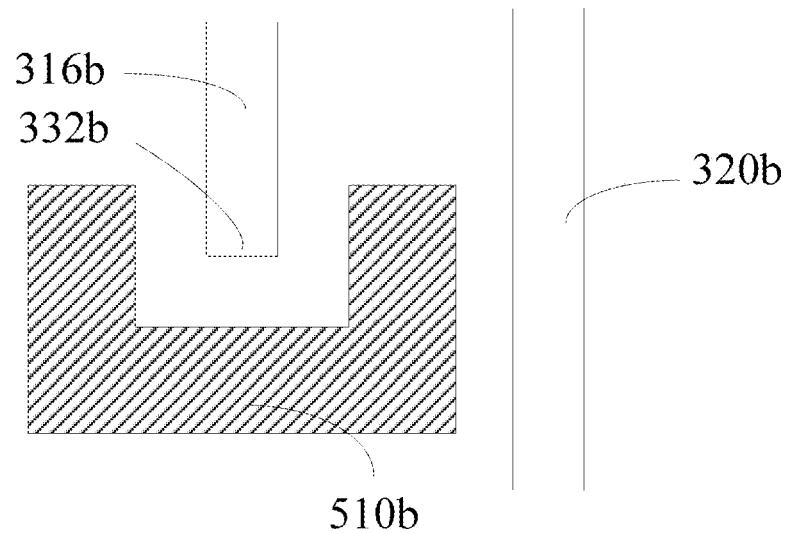
FIG. 18 is a schematic diagram of an extension portion according to another embodiment of the present disclosure.

For example, as illustrated in FIG. 18, an electrostatic discharge portion 510b is positioned on all three side surfaces of an end 332b of an extension portion 316b (the end 332b has three side surfaces S21, S22 and S23 similar with those in FIG. 17), and wraps the end 332b. Therefore, more discharge channels can be formed. For example, at a position where the electrostatic discharge portion 510b and the end 332b face to each other, a spacing between the electrostatic discharge portion 510b and the end 332b is unchanged, so that a plurality of discharge channels have the same length and more electrostatic charges can be simultaneously discharged.

Figure 19:
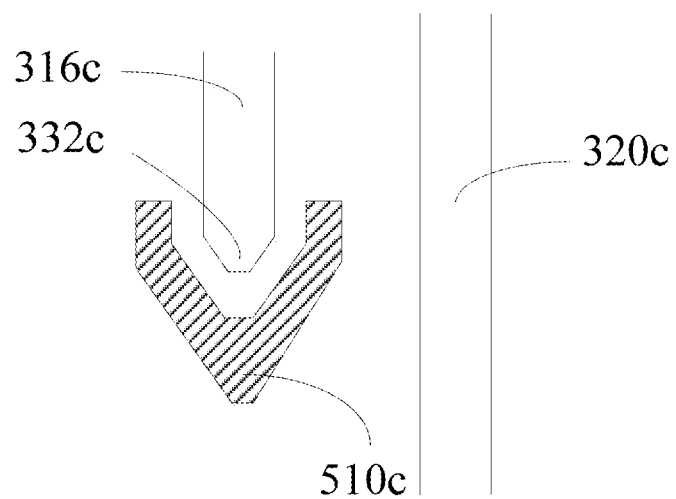
FIG. 19 is a schematic diagram of an extension portion according to yet another embodiment of the present disclosure.
Figure 20:
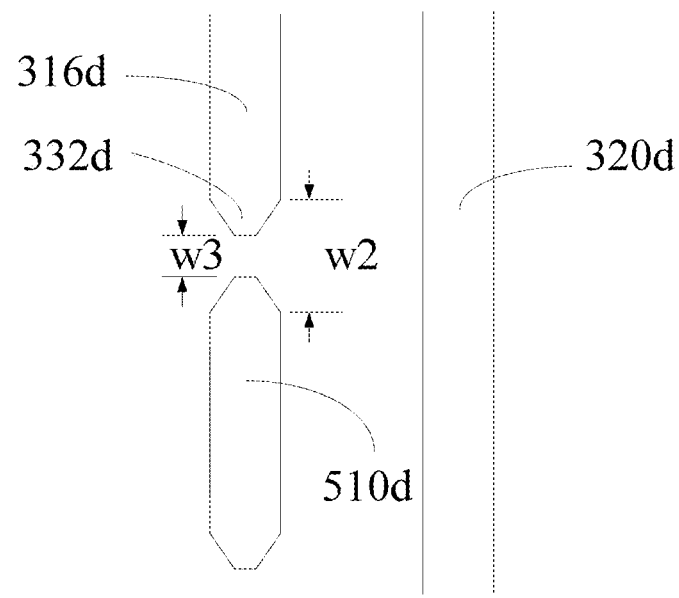
FIG. 20 is a schematic diagram of an extension portion according to still another embodiment of the present disclosure.

According to the embodiments of the present disclosure, the end of the extension portion is similar with the end portion of the conductive portion, which is described in the previous embodiments, can be of various shapes, such as in a shape of a flat head, a round head shape or a sharp head and the like, and can be of a regular or irregular shape. For example, the end of the extension portion is of any one of the shape as illustrated in FIG. 13(a) to FIG. 13(c). The end of the extension portion in FIG. 14 and FIG. 18 is of a flat head shape. For example, as illustrated in FIG. 19, an electrostatic discharge portion 510c is positioned on three side surfaces of an end 332c of an extension portion 316c. The end 332c of the extension portion 316c is of a tapered shape similar with a cone, and at the moment, the electrostatic charges are easier to accumulate in a tapered portion. For example, an inner surface of the electrostatic discharge portion 510c is of the same shape with an outer surface of the end 332c, so that the matching degree of the electrostatic discharge portion 510c and the end 332c in shape is better and the case that the electrostatic charges enter a second conductive portion 320c is further avoided, thereby effectively protecting the second conductive portion 320c. For example, as illustrated in FIG. 20, an electrostatic discharge portion 510d is positioned on a side surface S22 of an end 332d of an extension portion 316d. The end 332d of the extension portion 316d is of a tapered shape, both upper and lower end portions of the electrostatic discharge portion 510d are also of a tapered shape, and the upper end portion and the end 332d have the same width and positioned on the same central line. A spacing between the extension portion 316d and the electrostatic discharge portion 510d is gradient, i.e., a spacing W3 on the central line is the shortest, spacings W2 on both sides of the central line are the longest. In this case, the electrostatic charges are easier to accumulate at the position of the spacing W3, so that discharge is easier to occur.

Figure 21:
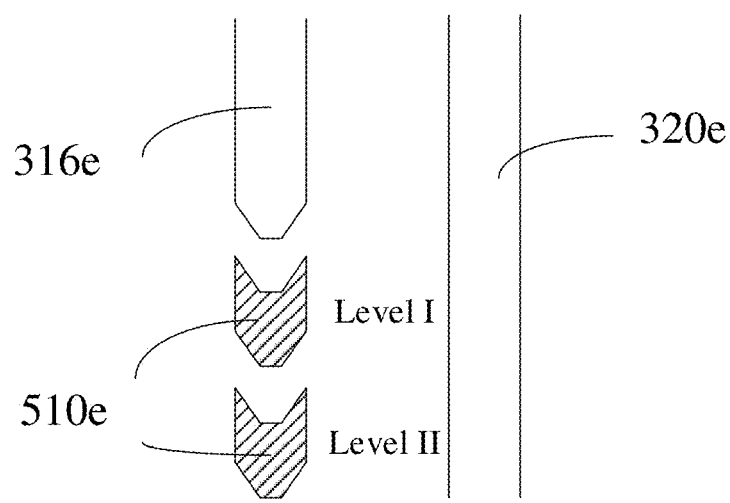
FIG. 21 is a schematic diagram of an extension portion according to another embodiment of the present disclosure.

In at least some embodiments, the electrostatic discharge protection circuit includes at least two levels of electrostatic discharge units, the at least two levels of electrostatic discharge units are arranged on at least one side surface of the end of the extension portion; each level of electrostatic discharge unit includes the at least one electrostatic discharge portion, and the distances between the at least two levels of electrostatic discharge units and the end of the extension portion are sequentially increased. For example, as illustrated in FIG. 14, two levels of electrostatic discharge units are arranged on the side surface S12 of the end 332 of the extension portion 316, the first-level electrostatic discharge unit includes the electrostatic discharge portion 310a, and the second-level electrostatic discharge unit includes the electrostatic discharge portion 310b. According to the discharge principle of multiple levels of discharge units in the previous embodiments, the electrostatic charges can be firstly discharged at the electrostatic discharge portion 310a, and then second discharge is carried out at the electrostatic discharge portion 310b. Therefore, the electrostatic charges can be repeatedly discharged, and by multiple levels of discharge units, the accumulated electrostatic charges can be discharged at any time, so as to reduce the risk that the electrostatic charges enter the second conductive portion. For another example, as illustrated in FIG. 21, two levels of electrostatic discharge units are arranged at an end of an extension portion 316e, and each level of electrostatic discharge unit includes a single electrostatic discharge portion 510e. The electrostatic discharge portion 510e at level II is further away from the end of the extension portion 316e, and thus, the electrostatic discharge portion 510e at level I discharges first. In FIG. 21, the end of the extension portion 316e is of a tapered shape, and a surface of each electrostatic discharge portion 510e, which facing toward the extension portion 316e, is of the same shape with the end of the extension portion, so that a spacing between the electrostatic discharge portion and the end of the extension portion 316e is unchanged, i.e., the discharge channels have the same length, and thus, more charges can be simultaneously discharged.

Figure 22:
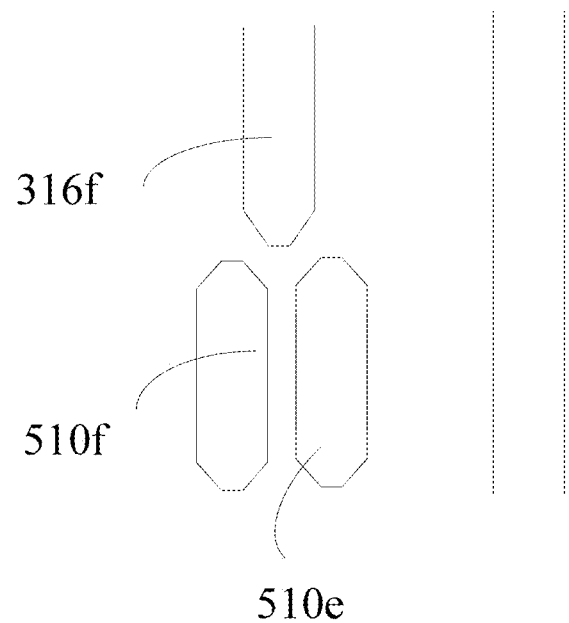
FIG. 22 is a schematic diagram of an extension portion according to yet another embodiment of the present disclosure.
Figure 23:
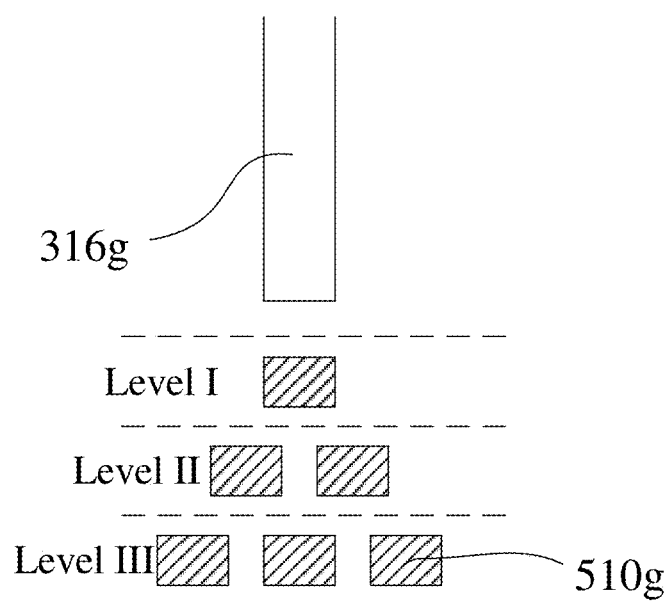
FIG. 23 is a schematic diagram of an extension portion according to still another embodiment of the present disclosure.

In at least some embodiments, at least one level of electrostatic discharge unit includes a plurality of electrostatic discharge portions, and the distances between the plurality of electrostatic discharge portions in the same level of electrostatic discharge unit and the end of the extension portion are equal to each other. For example, as illustrated in FIG. 22, distances between two electrostatic discharge portions 510f and 510e in the same level of electrostatic discharge unit and an end of an extension portion 316f are equal to each other. For another example, as illustrated in FIG. 23, three levels of electrostatic discharge units are arranged on the same side surface of an end of an extension portion 316g, a higher level of discharge unit is provided with more electrostatic discharge portions, and it can be seen from FIG. 23 that distances between a plurality of electrostatic discharge portions 510g in the same level of electrostatic discharge unit and the end of the extension portion 316g are equal to each other. For the specific structures of multiple levels of electrostatic discharge units in FIG. 23, description in FIG. 12 can be referred to, and is not repeated herein.

Figure 24:
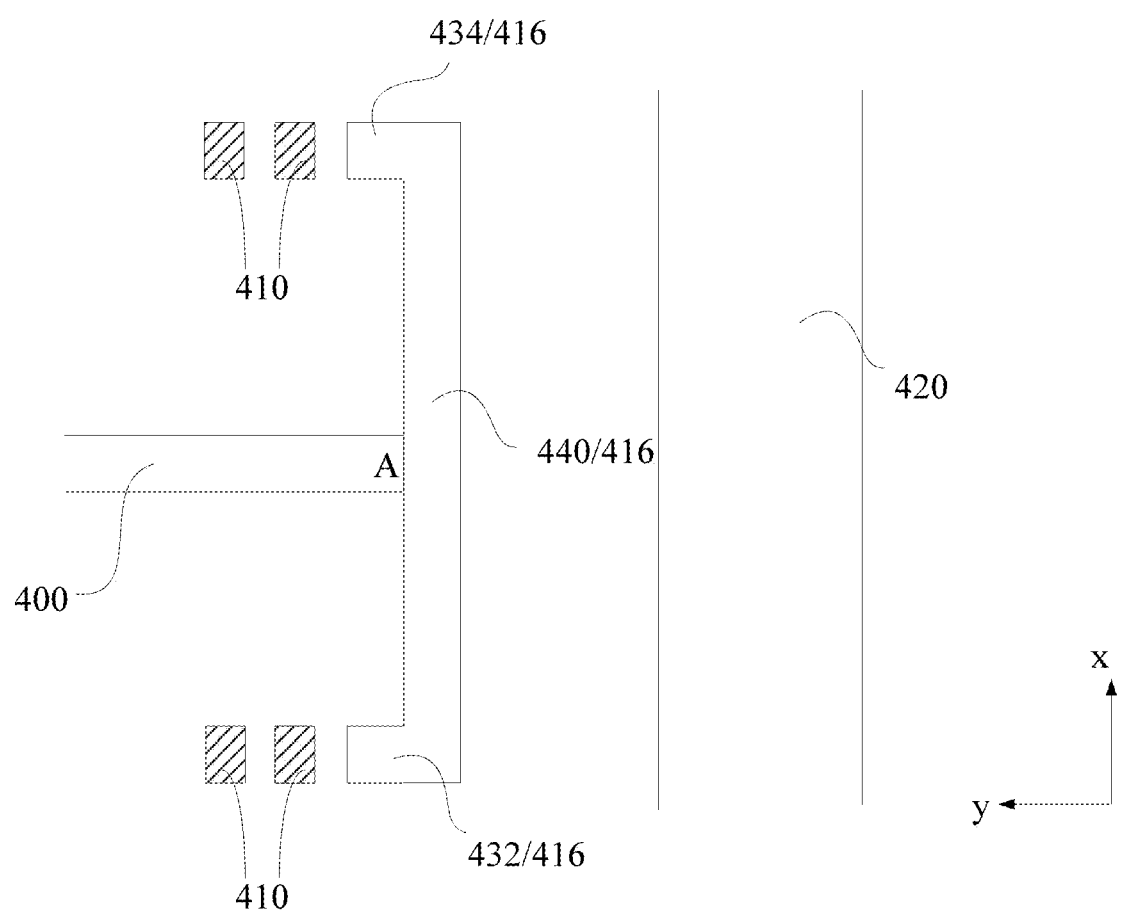
FIG. 24 is a schematic diagram of an electrostatic discharge protection circuit according to yet another embodiment of the present disclosure.

In at least some embodiments, the extension portion has a part extending towards a direction away from the second conductive portion. Therefore, the end of the extension portion can be further away from the second conductive portion so as to avoid the case that the electrostatic charges are close to or enter the second conductive portion. For example, the extension portion includes a first part and a second part, an extension direction of the first part is the same with an extension direction of the second conductive portion, and an extension direction of the second part is perpendicular to the extension direction of the first part and extends towards a direction away from the second conductive portion. For example, as illustrated in FIG. 24, an extension portion 416 extends from an end portion A of a first conductive portion 400, and the extension portion 416 includes a first part 440 and second parts 432 and 434. An extension direction of the first part 440 and an extension direction of the second conductive portion 420 are the same and are both a vertical direction (an x direction), so that the extension portion 416 and the second conductive portion 420 can be always kept in parallel to each other and a spacing between the extension portion 416 and the second conductive portion 420 is unchanged, thereby further avoiding the case that the electrostatic charges are close to the second conductive portion. Extension directions of the second parts 432 and 434 are a horizontal direction (a y direction), which is perpendicular to the extension direction of the first part, and extend towards a direction away from the second conductive portion 420. Therefore, electrostatic discharge blocks 410 arranged at ends of the second parts 432 and 434 of the extension portion 416 can be further away from the second conductive portion 420 so as to further prevent the electrostatic charges from entering the second conductive portion 420. It should be understood that in the embodiments of the present disclosure, the extension directions of the second parts 432 and 434 of the extension portion 416 may be not the y direction as illustrated in FIG. 24 and for example, is a direction at a certain angle with the x direction, and the angle, for example, is between 0 degree and 90 degrees. Moreover, the ends of the second parts 434 and 432 of the extension portion 416 may be of various shapes, which may be referred to the shape of the end of the extension portion as described in the previous embodiments, and for the arrangement mode of the electrostatic discharge block 410, description in the previous embodiments can be referred to, and is not repeated herein. The shape and the extension direction of the extension portion may be set according to the shape and the position of the second conductive portion.

In at least some embodiments, the extension portion, the first conductive portion, the second conductive portion and the electrostatic discharge portion are made of the same material and are arranged on the same layer. For the specific arrangement mode and production process, description in the previous embodiments can be referred to, and is not repeated herein.

The electrostatic discharge circuit described in the embodiments of the present disclosure can be applied to any electronic circuit, e.g., a circuit board of a semiconductor device. Illustration will be carried out below by taking a case that the electrostatic discharge circuit in the embodiments of the present disclosure is applied to a display substrate of a display apparatus as an example, and the display substrate includes, but is not limited to, an array substrate, a color filter substrate and the like.

An embodiment of the present disclosure further provides a display substrate, including the electrostatic discharge protection circuit according to any one of the previous embodiments. Illustration will be carried out below by taking a case that the electrostatic discharge circuit in FIG. 4 is applied to the display substrate as an example, and in this embodiment, the first conductive portion, for example, is a first signal line such as a gate line, and the second conductive portion, for example, is a second signal line such as a common electrode line.

Figure 25:
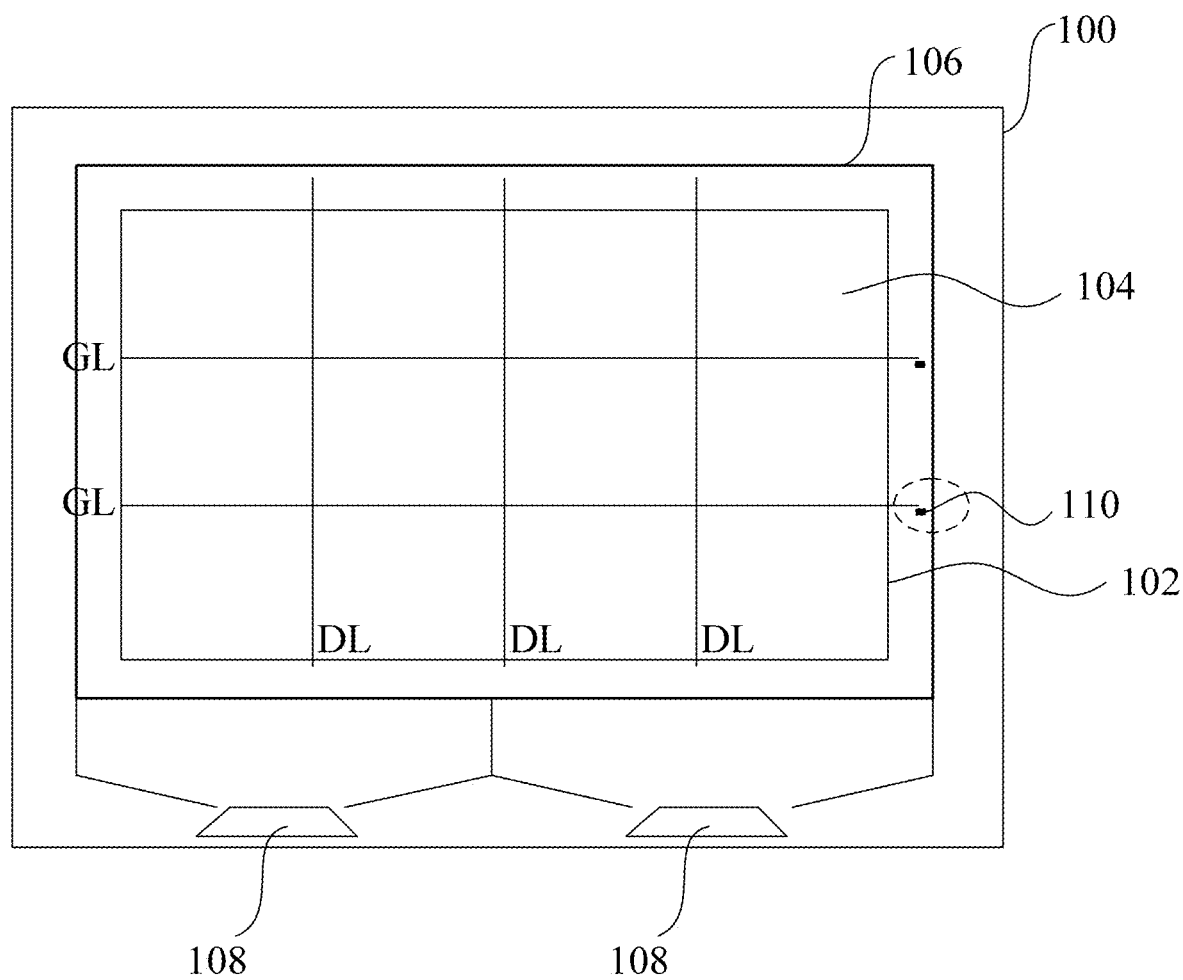
FIG. 25 is a schematic diagram of a display substrate according to an embodiment of the present disclosure.
Figure 26:
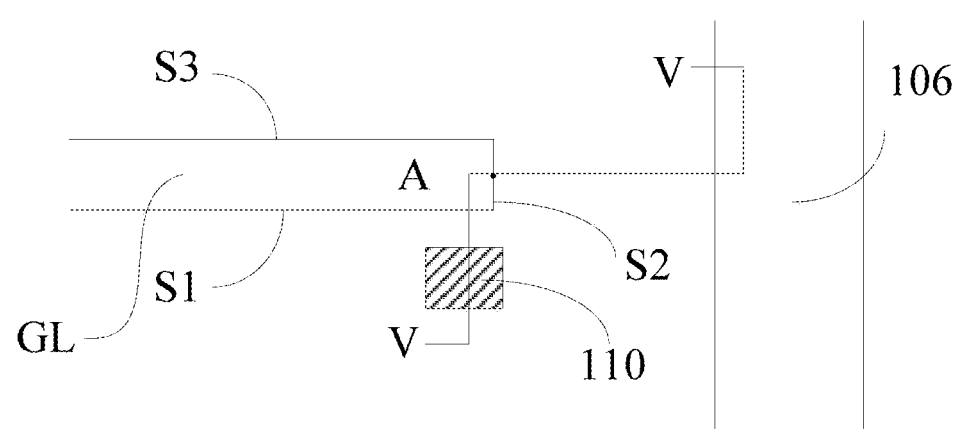
FIG. 26 is a partially enlarged schematic diagram of the display substrate in FIG. 25.
Figure 27:
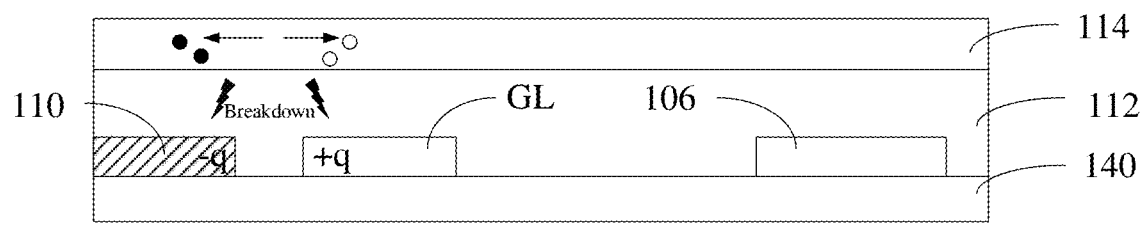
FIG. 27 is a sectional view along a V-V line in FIG. 26.

For example, as illustrated in FIG. 25 to FIG. 27, a display substrate 100 includes a display region 102 and a non-display region around the display region. The display region 102 is a region for displaying an image. The display substrate 100 includes a plurality of gate lines GL and a plurality of data lines DL, and in the display region 102, the plurality of gate lines GL and the plurality of data lines DL intersect to define a plurality of pixel units 104. The display substrate 100 further includes a common electrode line 106 and a signal source 108 which are positioned in the non-display region. The common electrode line 106 surrounds the display region 102, and for example, the signal source 108 provides a common voltage signal for the common electrode line 106. As illustrated in FIG. 26, in a dotted line region, a gap is reserved between an end portion of each gate line GL and the common electrode line 106.

As illustrated in FIG. 27, the display substrate 100 includes a base substrate 140, and both the gate line GL and the electrostatic discharge portion 110 are positioned on the base substrate 140. The gate line GL has an end portion A. The electrostatic discharge portion 110 is spaced from the end portion A of the gate line GL and is configured to discharge the electrostatic charges generated at the end portion A of the gate line GL. The electrostatic discharge portion 110 is positioned near the end portion A of the conductive portion, and the electrostatic charges accumulated at the end portion A can be discharged by the electrostatic discharge portion 110, and thus, the electrostatic discharge portion 110 can share a breakdown current so as to prevent the electrostatic charges from entering other effective circuits. In FIG. 27, for the specific structures of the gate line GL and the electrostatic discharge portion 110, the previous description related to the embodiment in FIG. 4 can be referred to, and is not repeated herein. In addition, for various deformations of the gate line GL and the end portion thereof, various deformations of the electrostatic discharge portion 110 and various position relationships possibly existing between the gate line GL and the electrostatic discharge portion 110, description on the first conductive portion and the electrostatic discharge portion in the previous embodiments can be referred to, and is not repeated herein.

For example, in the display substrate 100, the gate line GL, the common electrode line 106 and the electrostatic discharge portion 110 are all positioned on the base substrate 140, are arranged on the same layer and are spaced from each other. Similar to a relationship between m and n in FIG. 4, a distance between the end portion A of the gate line GL and the common electrode line 106 is greater than a distance between the end portion A of the gate line GL and the electrostatic discharge portion 110.

For example, the gate line GL further includes an extension portion, and for the specific structure of the extension portion, description on the extension portion in the previous embodiments can be referred to and is not repeated herein. For example, one part of the extension portion extends towards a direction away from the common electrode line 106, so as to further avoid the case that the electrostatic charges are close to the common electrode line 106.

For example, the display substrate 100 further includes an insulation layer 112 and an active layer 114. The insulation layer overlays all of the gate line GL, the common electrode line 106 and the electrostatic discharge portion 110, and the active layer 114 overlays the insulation layer 112; the insulation layer 112 is configured to enable the active layer 114 to be insulated from each of the gate line GL, the common electrode line 106 and the electrostatic discharge portion 110.

An embodiment of the present disclosure further provides a display apparatus, including the display substrate according to the previous embodiments. For example, the display apparatus includes apparatus with a display function, such as a mobile phone, a camera, an electronic photo album, a desktop computer, a tablet personal computer, a navigator and the like. The display apparatus is provided with the electrostatic discharge protection circuit described in the previous embodiments, and thus, the static electricity can be prevented from entering the effective circuits, and a display effect is increased.

In the disclosure, the following should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

The invention claimed is:

1. An electrostatic discharge protection circuit, comprising:
a first conductive portion, extending along a first direction and having an end portion, the end portion has two side surfaces opposite to each other in a second direction, the second direction being perpendicular to the first direction; and
at least two levels of electrostatic discharge units, arranged in the second direction and on each of two side surfaces of the end portion, wherein each level of the at least two levels of electrostatic discharge units comprises at least one electrostatic discharge portion, the at least one electrostatic discharge portion being arranged on a same layer as the first conductive portion and spaced from the end portion of the first conductive portion, the at least one electrostatic discharge portion being configured to discharge electrostatic charges generated at the end portion of the first conductive portion,
wherein distances between the at least two levels of electrostatic discharge units and the end portion of the first conductive portion are sequentially increased along the second direction.

2. The electrostatic discharge protection circuit according to claim 1, wherein the at least one electrostatic discharge portion is positioned on at least one side surface of the end portion of the first conductive portion.

3. The electrostatic discharge protection circuit according to claim 1, wherein one level of the at least two levels of electrostatic discharge units comprises a plurality of electrostatic discharge portions, and distances between the end portion of the first conductive portion and the plurality of electrostatic discharge portions in a same level of electrostatic discharge unit are equal to each other.

4. The electrostatic discharge protection circuit according to claim 1, wherein the first conductive portion further comprises an extension portion, the extension portion extends from the end portion of the first conductive portion to the at least two levels of electrostatic discharge units, and an end of the extension portion is spaced from the at least two levels of electrostatic discharge units.

5. The electrostatic discharge protection circuit according to claim 4, wherein the at least two levels of electrostatic discharge units are positioned on at least one side surface of the end of the extension portion.

6. The electrostatic discharge protection circuit according to claim 4, wherein the at least two levels of electrostatic discharge units are arranged on at least one side surface of the end of the extension portion, and distances between the end of the extension portion and the at least two levels of electrostatic discharge units are sequentially increased.

7. The electrostatic discharge protection circuit according to claim 6, wherein one level of the at least two levels of electrostatic discharge units comprises a plurality of electrostatic discharge portions, and distances between the end of the extension portion and the plurality of electrostatic discharge portions in a same level of electrostatic discharge unit are equal to each other.

8. The electrostatic discharge protection circuit according to claim 2, wherein the first conductive portion further comprises an extension portion, the extension portion extends from the end portion of the first conductive portion to the at least one electrostatic discharge portion, and an end of the extension portion is spaced from the at least one electrostatic discharge portion.

9. The electrostatic discharge protection circuit according to claim 3, wherein the first conductive portion further comprises an extension portion, the extension portion extends from the end portion of the first conductive portion to the at least one electrostatic discharge portion, and an end of the extension portion is spaced from the at least one electrostatic discharge portion.

10. A display substrate, comprising an electrostatic discharge protection circuit, wherein the electrostatic discharge protection circuit comprises:
a first conductive portion, extending along a first direction and having an end portion, the end portion has two side surfaces opposite to each other in a second direction, the second direction being perpendicular to the first direction; and
at least two levels of electrostatic discharge units, arranged in the second direction and on each of two side surfaces of the end portion, wherein each level of the at least two levels of electrostatic discharge units comprises at least one electrostatic discharge portion, the at least one electrostatic discharge portion being arranged on a same layer as the first conductive portion and spaced from the end portion of the first conductive portion, the at least one electrostatic discharge portion being configured to discharge electrostatic charges generated at the end portion of the first conductive portion,
wherein distances between the at least two levels of electrostatic discharge units and the end portion of the first conductive portion are sequentially increased along the second direction.

11. The display substrate according to claim 10, further comprising a second conductive portion, wherein the first conductive portion, the second conductive portion and the at least one electrostatic discharge portion are arranged on a same layer and spaced from each other, and a distance between the end portion of the first conductive portion and the second conductive portion is greater than a distance between the end portion of the first conductive portion and the at least one electrostatic discharge portion.

12. The display substrate according to claim 11, wherein the first conductive portion further comprises an extension portion, and the extension portion has a part extends towards a direction away from the second conductive portion.

13. The display substrate according to claim 11, wherein the first conductive portion comprises a first signal line, the second conductive portion comprises a second signal line, and a distance between an end portion of the first signal line and the second signal line is greater than a distance between the end portion of the first signal line and the at least one electrostatic discharge portion.

14. The display substrate according to claim 13, further comprising a base substrate, wherein the first signal line, the second signal line and the at least one electrostatic discharge portion all are positioned on the base substrate and arranged on a same layer.

15. The display substrate according to claim 14, further comprising an insulation layer and an active layer, wherein the insulation layer overlays each of the first signal line, the second signal line and the at least one electrostatic discharge portion, the active layer overlays the insulation layer, and the insulation layer is configured to enable the active layer to be insulated from each of the first signal line, the second signal line and the at least one electrostatic discharge portion.

16. A display apparatus, comprising the display substrate according to claim 12.

\* \* \* \* \*